(12) United States Patent
Yu et al.

(10) Patent No.: US 11,985,849 B2
(45) Date of Patent: May 14, 2024

(54) POLARIZER AND MANUFACTURING METHOD THEREOF, DISPLAY PANEL, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chi Yu, Beijing (CN); Yu Zhang, Beijing (CN); Weiyun Huang, Beijing (CN); Zhenli Zhou, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 487 days.

(21) Appl. No.: 17/415,771

(22) PCT Filed: Nov. 9, 2020

(86) PCT No.: PCT/CN2020/127469
§ 371 (c)(1),
(2) Date: Jun. 18, 2021

(87) PCT Pub. No.: WO2021/093702
PCT Pub. Date: May 20, 2021

(65) Prior Publication Data
US 2022/0069262 A1    Mar. 3, 2022

(30) Foreign Application Priority Data

Nov. 15, 2019 (CN) .......................... 201911121009.7

(51) Int. Cl.
*H10K 50/80* (2023.01)
*F21V 8/00* (2006.01)
(Continued)

(52) U.S. Cl.
CPC ......... *H10K 50/868* (2023.02); *G02B 5/3025* (2013.01); *G02B 6/0056* (2013.01); *G02F 1/133528* (2013.01); *H10K 59/65* (2023.02)

(58) Field of Classification Search
CPC ...... H10K 50/868; H10K 59/65; H10K 50/86; H10K 50/85; G02B 5/3025; G02B 6/0056;
(Continued)

(56) References Cited

U.S. PATENT DOCUMENTS 10,690,959 B2    6/2020   Li et al.
2008/0240194 A1*  10/2008  Maeda ................ H01S 5/18355
                                                        372/50.1
(Continued)

FOREIGN PATENT DOCUMENTS

CN    108594524 A    9/2018
CN    108957838 A    12/2018
(Continued)

*Primary Examiner* — Mariam Qureshi
(74) *Attorney, Agent, or Firm* — Chiwin Law LLC (57) ABSTRACT

A polarizer and a manufacturing method thereof, a display panel, and a display device are provided. The polarizer includes a polarizing layer, and the polarizing layer includes a first polarizing region and a second polarizing region. A light transmittance of the first polarizing region is greater than a light transmittance of the second polarizing region, and a ratio of the light transmittance of the first polarizing region to the light transmittance of the second polarizing region is 1.1:1 to 2.6:1.

18 Claims, 6 Drawing Sheets

(51) Int. Cl.
    *G02B 5/30*     (2006.01)
    *G02F 1/1335*     (2006.01)
    *H10K 59/65*     (2023.01)

(58) Field of Classification Search
    CPC ........ G02B 5/3033; G02B 5/30; G02B 27/28; B29D 11/00788; H04N 23/57; G02F 1/133528; G02F 1/133543; G02F 1/133536
    See application file for complete search history.

(56) References Cited

U.S. PATENT DOCUMENTS

| | | | |
|---|---|---|---|
| 2013/0335822 A1 | 12/2013 | Yeh et al. | |
| 2015/0168766 A1 | 6/2015 | Kuk et al. | |
| 2016/0238883 A1* | 8/2016 | Yao | G02F 1/133753 |
| 2017/0090072 A1* | 3/2017 | Maeda | G02B 5/3025 |
| 2018/0186109 A1* | 7/2018 | Byun | B29D 11/00644 |
| 2022/0149117 A1* | 5/2022 | Yuan | H10K 59/121 |

FOREIGN PATENT DOCUMENTS

| | | |
|---|---|---|
| CN | 209215619 U | 8/2019 |
| CN | 110391254 A | 10/2019 |
| CN | 110780375 A | 2/2020 |

\* cited by examiner

POLARIZER AND MANUFACTURING METHOD THEREOF, DISPLAY PANEL, AND DISPLAY DEVICE

This application is a U.S. National Phase Entry of International Application No. PCT/CN2020/127469, filed on Nov. 9, 2020, designating the United States of America and claiming priority to Chinese Patent Application No. 201911121009.7, filed on Nov. 15, 2019. The present application claims priority to and the benefit of the above-identified applications and the above-identified applications are incorporated by reference herein in their entirety.

TECHNICAL FIELD

Embodiments of the present disclosure relate to a polarizer and a manufacturing method thereof, a display panel, and a display device.

BACKGROUND

With the development of display electronic product such as a mobile phone, increasing of the screen ratio of a display screen has become a trend, and some essential functional components, such as a front camera, of the mobile phone have become a major factor which restricts the increasing of the screen ratio. To solve this problem, an under-screen camera is designed and developed.

For an OLED (Organic Light-Emitting Diode) display device, a polarizer is used to resist ambient light and reduce the interference of ambient light on display, but at the same time, the polarizer weakens the intensity of the light entering the camera under the screen and affects the imaging quality of the camera under the screen.

SUMMARY

At least one embodiment of the disclosure provides a polarizer, and the polarizer comprises a polarizing layer. The polarizing layer comprises a first polarizing region and a second polarizing region; and a light transmittance of the first polarizing region is greater than a light transmittance of the second polarizing region, and a ratio of the light transmittance of the first polarizing region to the light transmittance of the second polarizing region is 1.1:1 to 2.6:1.

For example, the first polarizing region and the second polarizing region are integral with each other.

For example, the light transmittance of the first polarizing region is 60% to 90%.

For example, the light transmittance of the second polarizing region is 35% to 55%.

For example, the polarizer comprises: a first protective layer, provided on one side of the polarizing layer; and a second protective layer, provided on other side of the polarizing layer.

For example, each of the first protective layer and the second protective layer is a cellulose triacetate layer; and the polarizing layer is a polyvinyl alcohol layer.

At least one embodiment of the disclosure provides a manufacturing method of a polarizer, and the method comprises: providing a polarizing layer to be treated; treating the polarizing layer to be treated to obtain a treated polarizing layer, in which treated polarizing layer comprises a first polarizing region and a second polarizing region, a light transmittance of the first polarizing region is greater than a light transmittance of the second polarizing region, and a ratio of the light transmittance of the first polarizing region to the light transmittance of the second polarizing region is 1.1:1 to 2.6:1; and forming the polarizer by using the treated polarizing layer.

For example, the treating the polarizing layer to be treated comprises: treating the first polarizing region, so that the light transmittance of the first polarizing region is increased to be greater than the light transmittance of the second polarizing region.

For example, before the treating the polarizing layer to be treated, the method further comprises: forming an additional layer on at least one side of the polarizing layer to be treated, thereby the polarizing layer to be treated is treated in a state where the additional layer is formed.

For example, the treating the polarizing layer to be treated further comprises: providing a mask plate with an opening corresponding to the first polarizing region, attaching the mask plate on at least one side of the polarizing layer to be treated, treating the polarizing layer to be treated under a treatment temperature for a treatment time, so that the light transmittance of the first polarizing region is increased to be greater than the light transmittance of the second polarizing region.

For example, at the same time of treating the polarizing layer to be treated under the treatment temperature, the polarizing layer to be treated is under a treatment humidity.

For example, the treatment temperature is 85° C. to 150° C., the treatment humidity is greater than or equal to 70%, and the treatment time is greater than or equal to 0.5 hours.

For example, the treating the polarizing layer to be treated further comprises: irradiating light to the first polarizing region of the polarizing layer to be treated so as to increase the light transmittance of the first polarizing region to be greater than the light transmittance of the second polarizing region.

For example, the light that is irradiated comprises blue light, ultraviolet light, or x-ray.

For example, the treating the polarizing layer to be treated further comprises: applying a reagent to the first polarizing region of the polarizing layer to be treated under a treatment humidity for a treatment time, wherein the treatment humidity is greater than or equal to 70%, and the treatment time is greater than or equal to 0.5 hours.

At least one embodiment of the disclosure provides a display panel comprising the polarizer as described above.

For example, the display panel further comprises: a base substrate, and a display function layer, provided on the base substrate and comprising a first display region and a second display region. The polarizer is provided on a light emission side of the display functional layer, and an orthographic projection of the second display region on the base substrate overlaps an orthographic projection of the first polarizing region on the base substrate.

For example, the first display region comprises a first pixel array, the second display region comprises a second pixel array, and a density of pixel units of the first pixel array is greater than a density of pixel units of the second pixel array.

At least one embodiment of the disclosure provides a display device. The display device comprises: the display panel as described above, and an image sensor. The photosensitive surface of the image sensor faces the display panel, and an orthographic projection of the image sensor on the base substrate at least partially overlaps an orthographic projection of the second display region on the base substrate.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objectives, technical details, and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

Polarizer (POL for short) is also known as polarizing plate. The polarizer is an optical film which comprises multiple polymer material layers and has the function of generating polarized light. The polarizer converts un-polarized incident light into polarized emission light.

The polarizer includes a polymer iodine polyvinyl alcohol (PVA) type, a dichroic organic dye type and the like. The manufacturing method of the PVA type polarizer includes: immersing a PVA film in a mixed potassium iodide solution containing multivalent iodine ions ($I^{5-}$ or $I^{3-}$), and stretching the PVA film in the mixed potassium iodide solution along a uniaxial direction. The PVA molecules align along a single direction after being stretched by external force, which promotes the iodine molecules attached to the PVA molecules to align along the same direction as PVA molecules. The stretched elongated iodine molecules absorb the light vibrating parallel to the long axis of iodine molecules and transmit the light vibrating perpendicular to the long axis of iodine molecules, thus obtaining the polarized light. For example, the light transmittance of the polarizer is 38%-48%, and changes with the change of iodine absorption amount.

Figure 1A:
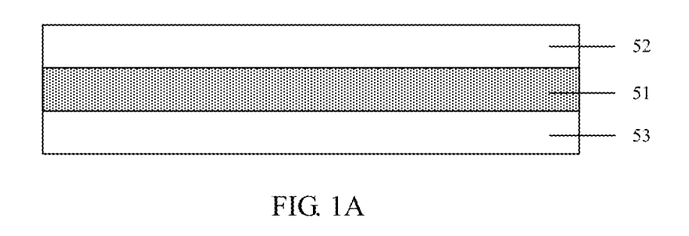
FIG. 1A illustrates a PVA type polarizer.

FIG. 1A illustrates the PVA type polarizer. The PVA type polarizer includes a polarizing layer and protective layers respectively provided at the upper surface and the lower surface of the polarizing layer. The polarizing layer is the PVA layer 51 which has been treated as described above to have polarizing effect. In order to maintain the stretched state of the iodine molecules in the PVA layer 51 and protect the iodine molecules from being influenced by the external environment, a transparent protective layer 52 and a transparent protective layer 53 are attached to the upper surface and the lower surface of the PVA layer 51, respectively. For example, each of the protective layers includes cellulose triacetate (TAC).

Figure 1B:
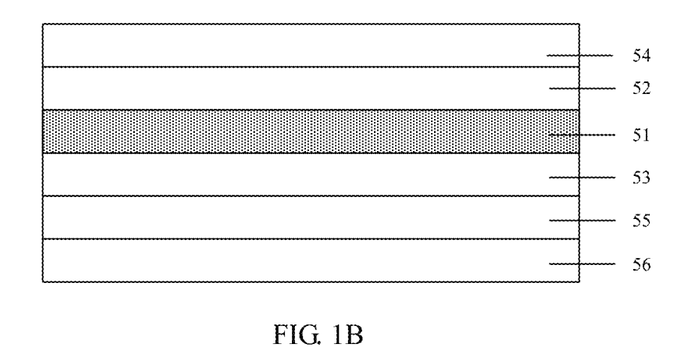
FIG. 1B illustrates another PVA type polarizer.

FIG. 1B illustrates another PVA type polarizer. This PVA type polarizer is based on the polarizer as shown in FIG. 1A, and includes more layers to facilitate storage and, for example, attachment to a display panel. In addition to the PVA layer 51, the protective layer 52, and the protective layer 53, the polarizer shown in FIG. 1B further includes a surface protective film 54 located at an outer side (the upper side in the figure) of the protective layer 52, an adhesive layer 55 located at an outer side (the lower side in the figure) of the protective layer 53, and a peelable protective film (i.e. a release film) 56 located at an outer side of the adhesive layer 55. The polarizer for example is stored in a curled state; and in the case where the polarizer needs to be used, the polarizer is unfolded and cut according to actual requirement, and the protective film 56 is peeled off and the polarizer is adhered to the surface of the display panel through the adhesive layer 55. The protective film 54 and/or the release film 56 are/is, for example, a polyethylene terephthalate (PET) film.

As an example of the application of the polarizer, the polarizer is applied into OLED (Organic Light-Emitting Diode) display device. For example, the OLED display device includes metal electrodes, which are configured as anode and cathode of the light-emitting diode. However, these metal electrodes are reflective and reflect the ambient light entering the OLED display device; and therefore, the user's experience is adversely affected because of the reflection of ambient light during the user watches the OLED display device, the contrast of the OLED display device is reduced and the imaging quality of the OLED display device, especially under strong light or outdoors, is adversely affected. In order to solve this problem, whether the OLED display device is of a bottom-emission type or a top-emission type, it is necessary to attach the polarizer on the light-emission side of the display device to reduce the reflection of ambient light.

With the development of the display electronic product such as mobile phone, the increase of the proportion of the display screen has become a trend, and some essential functional components such as the front camera of the mobile phone have become a major factor for restricting the increase of the proportion of the screen. To solve this problem, the under-screen camera is designed and developed, that is, the image sensor (or the camera module including the image sensor) is arranged under the display panel and located in the display region, and the external light enters into the image sensor after passing through the display panel. However, the transmittance of the polarizer is about 45%; and therefore, the polarizer not only reduces the reflection of the external light, but also weakens the intensity of the light entering the under-screen camera, which adversely affect the imaging quality of the camera under the screen.

At least for the purpose of solving the technical problems existing in the above-mentioned OLED display device with under-screen camera, inventors noticed that a polarizer comprising a region having a higher light transmittance as well as having a certain polarization function is needed.

At least one embodiment of the present disclosure provides a polarizer. The polarizer includes a polarizing layer. The polarizing layer of the polarizer includes a first polarizing region and a second polarizing region, a light transmittance of the first polarizing region is greater than a light transmittance of the second polarizing region, and a ratio of the light transmittance of the first polarizing region to the light transmittance of the second polarizing region is 1.1:1 to 2.6:1. At least one embodiment of the present disclosure further provides a manufacturing method of the polarizer. For example, the polarizer in which the polarizing layer has the same light transmittance in the first and second polarizing regions is subjected to a secondary treatment so that the light transmittance of the first polarizing region is greater than the light transmittance of the second polarizing region. For example, during the process of forming the polarizer, the polarizing layer is treated for example by high temperature, photocatalysis, or a reagent to change local physical and chemical material properties of the polarizing layer, thereby changing the local light transmittance of the polarizing layer, and obtaining the polarizer comprising the region having a higher light transmittance as well as having a certain polarization.

At least one embodiment of the present disclosure further provides a display panel including the polarizer and a display device including the display panel.

It should be noted that, as understood by those skilled in the art, the "light transmittance" described here refers to a ratio of the intensity of the light (for example visible light) passing through a medium layer to the intensity of the incident light. In the case where the light transmittance is 100%, it means that the medium layer is completely transparent. In the case where the light transmittance is 0, it means that the medium layer is completely opaque. In the case where the light transmittance is greater than 0 and smaller than 100%, it means that the medium layer is partially transparent. The higher the light transmittance is, the better the light transmittance property of the medium layer is.

Figure 2A:
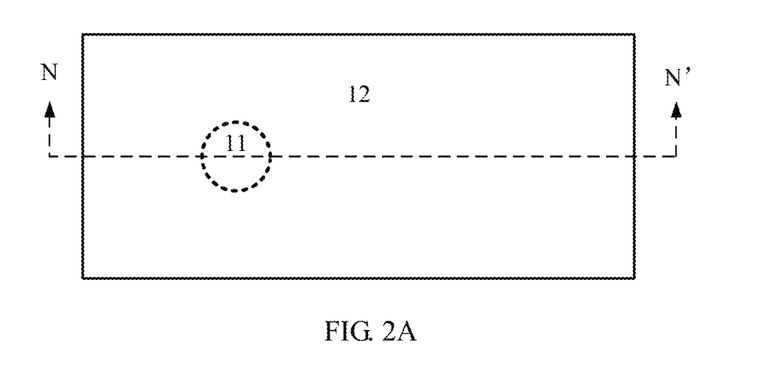
FIG. 2A is a schematic view of a polarizer according to at least one embodiment of the present disclosure.
Figure 2B:
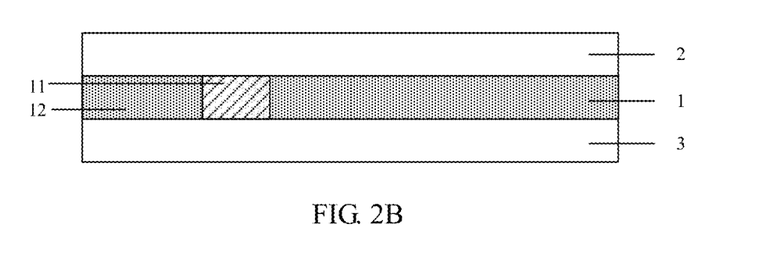
FIG. 2B is a schematic cross-sectional view of an example of the polarizer shown in FIG. 2A taken along the line N-N'.

FIG. 2A is a schematic view of the polarizer according to at least one embodiment of the present disclosure; FIG. 2B is a schematic cross-sectional view of an example of the polarizer as shown in FIG. 2A taken along the line N-N'. As shown in FIG. 2A and FIG. 2B, the polarizer includes a first protective layer 2, a polarizing layer 1, and a second protective layer 3 stacked in sequence, i.e., the first protective layer 2 is stacked on one side of the polarizing layer 1 and the second protective layer 3 is stacked on the other side of the polarizing layer 1. In other words, the first protective layer 2 and the second protective layer 3 are respectively arranged on two opposite sides of the polarizing layer 1. The polarizing layer 1 is the main component of the polarizer. The polarizing layer 1 determines the polarizing performance and the light transmittance of the polarizer, and the polarizing layer 1 also affects the color tone and optical durability of the polarizer. The polarizing layer 1 includes a first polarizing region 11 and a second polarizing region 12, a light transmittance of the first polarizing region 11 is greater than a light transmittance of the second polarizing region 12, and a ratio of the light transmittance of the first polarizing region 11 to the light transmittance of the second polarizing region 12 is ranged from 1.1:1 to 2.6:1.

For example, the first polarizing region 11 and the second polarizing region 12 are integral with each other. It should be noted that "integral" means that the first polarizing region 11 and the second polarizing region 12 are formed by the same piece or layer of material and are continuous with each other without an interface therebetween.

For example, the first polarizing region 11 is located between and adjacent to two second polarizing regions 12. For example, as shown in FIG. 2A, the first polarizing region 11 is surrounded by the second polarizing region 12. The first polarizing region 11 is of, for example, a circle. For example, there is no clear boundary between the first polarizing region 11 and the second polarizing region 12 but there is a transition area; and therefore, the first polarizing region 11 exemplarily is a region surrounding by a dashed line in FIG. 2A. The embodiments of the present disclosure are not limited to this, and the structure as shown in FIG. 2A is only exemplary. For example, the shape, the position, and the area of the first polarizing region 11 are designed according to the actual requirements on local light transmittance, for example, according to the size and position of the image sensor of the display device using the polarizer.

For example, the light transmittance of the first polarizing region 11 is ranged from 60% to 90%, that is, the first polarizing region 11 has a relatively high light transmittance and at the same time has a polarization performance. For example, the light transmittance of the first polarizing region 11 is 60%, 65%, 70%, 75%, 80% or 90%. For example, the light transmittance of the first polarizing region 11 is ranged from 65% to 75%, so that the light transmittance and polarization performance are better balanced and guaranteed. Considering the base material of the polarizing layer 1, the first polarizing region 11 is not completely transparent.

For example, the light transmittance of the second polarizing region 12 is ranged from 35% to 55%, that is, the light transmittance of the second polarizing region 12 is approximately equal to the light transmittance of the polarizing layer of a normal polarizer. For example, the light transmittance of the second polarizing region 11 is 35%, 45% or 55%.

For example, the polarizing layer 1 is the PVA layer, which may refer to the above descriptions of the PVA layer and is not described here for simplicity. The polarizing layer 1 made of the PVA layer which is immersed in the potassium iodide solution and then is uniaxially stretched is easily affected by the environment and loses the polarizing performance. Therefore, it is necessary to arrange the protective layer with good optical uniformity and transparency on both side surfaces of the polarizing layer 1 to block moisture and air and protect the polarizing layer 1.

For example, the first protective layer 2 and the second protective layer 3 are TAC layers, which have excellent physical support performance, high light uniformity, high transparency and high water absorption performance, and thus protect the PVA layer from water and air.

Figure 2C:
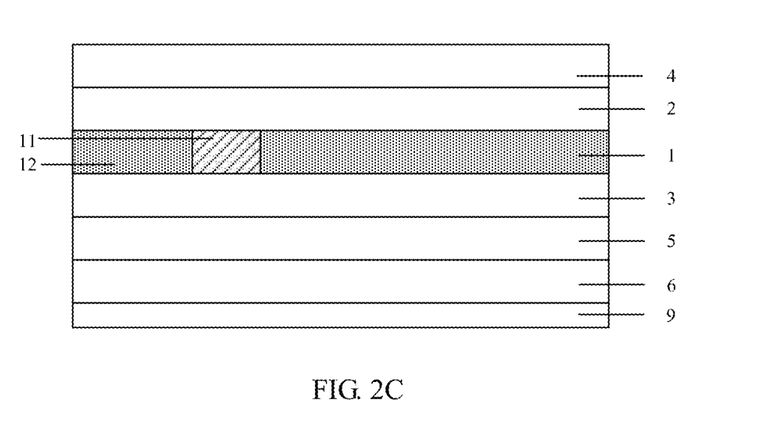
FIG. 2C is a schematic cross-sectional view of another example of the polarizer shown in FIG. 2A taken along the line N-N'.

FIG. 2C is another schematic view of the polarizer according to at least one embodiment of the present disclosure, which is a schematic cross-sectional diagram taken along the line N-N' of another example of the polarizer as shown in FIG. 2A. On the basis of the polarizer as shown in FIG. 2B, in order to add different functions, the polarizer of FIG. 2C includes a first functional layer 4, the first protective layer 2, the polarizing layer 1, the second protective layer 3, a second functional layer 5, an adhesive layer 6, and a release layer 9, which are sequentially stacked. The first protective layer 2, the polarizing layer 1, and the second protective layer 3 have been described in the previous descriptions, which will not be repeated here.

For example, the first functional layer 4 is a protective film, for example, a PE (polyethylene) layer with one side thereof being coated with an EVA (ethylene vinyl acetate) layer, and the PE layer has low viscosity and plays a role of protecting the surface of the first protective layer 2.

For example, the second functional layer 5 is a compensation layer with an optical anisotropy and compensation performance, and for example has a compensation effect for the wavelengths in the whole visible light waveband, for example, the second functional layer 5 is a ¼λ wave plate. For example, the second functional layer 5 is a same protective film as the first functional layer 4.

The above arrangement of the first functional layer 4 and the second functional layer 5 is only exemplary, and the embodiments of the present disclosure are not limited thereto. The first functional layer 4 and the second functional layer 5 for example are provided with functions according to actual applications and requirements. For example, the first functional layer 4 or the second functional layer 5 is not provided according to actual requirements.

The adhesive layer 6 is configured to adhere the polarizer to the light-emission side of the display panel, for example adhere the polarizer to an encapsulation layer or a cover plate of the display panel. For example, the adhesive layer 6 includes a pressure sensitive adhesive. The main components of the pressure sensitive adhesive are styrene thermoplastic elastomers, such as SIS, SBS, epoxidized SBS, etc.

Here, SIS is a styrene-isoprene-styrene triblock copolymer, SBS is a styrene-butadiene triblock copolymer, both of SIS and SBS have characteristics of rubber and plastic, are easily available and have an acceptable price, and thus are very suitable for being used as the elastomer component of pressure sensitive adhesives. SIS is highly elastic and resistant to water, alcohol, weak acid, and weak base. Only esters, ketones, and hydrocarbons can dissolve or swell SIS. For example, the adhesive layer 6 includes a photo-curing adhesive, such as an ultraviolet-curing adhesive or an infrared-curing adhesive. In the embodiments of the present disclosure, the adhesive layer 6 is not limited to the above examples, as long as it is an adhesive material with high light transmittance and capable of realizing reliable adhesion.

For purpose of storage, transportation, etc., the release layer 9 for example is attached to the surface of the adhesive layer 6 to protect the adhesive layer 6, and the release layer 9 is, for example, a PET film. In the case where the polarizer needs to be adhered to the surface of the display panel, the release layer 9 is removed first, and then the polarizer is adhered to the display panel through the adhesive layer 6.

It should be noted that the stacking structure and the arrangement of each layer of the polarizer in the embodiments of the present disclosure may be changed according to actual requirements, the layers of the polarizer may have various combinations, and the total number of the layers of the polarizer may be increased or decreased according to actual requirements.

At least one embodiment of the present disclosure provides a method of manufacturing the polarizer. For example, the method performs a secondary treatment on the formed polarizer (e.g., the polarizer as shown in FIG. 1A or FIG. 1B) so as to obtain the polarizer according to the embodiments of the disclosure, or the method performs a treatment only on the polarizing layer in the process of forming the polarizer so as to obtain the polarizer according to the embodiments of the disclosure. The manufacturing method of the polarizer provided by at least one embodiment of the present disclosure will be described with reference to FIG. 3 to FIG. 7.

The manufacturing method of the polarizer mainly involves the treatment of the polarizing layer. More specifically, a region of the polarizing layer is treated to obtain the first polarizing region, which loses a certain degree of polarizing performance but has the light transmittance greater than the light transmittance of other regions of the polarizing layer, such as the second polarizing region. For example, the polarizing layer 1 made of PVA layer easily absorbs water, resulting in that a certain degree of polarizing performance is lost, thus improving the light transmittance. For example, under the action of photocatalysis or high temperature, the PVA layer is degraded, thus losing a certain degree of polarizing performance and improving the light transmittance. In at least one embodiment, during the manufacturing process of the polarizer, the polarizing performance of the second polarizing region, which is different from the first polarizing region, is substantially unchanged, and thus the light transmittance of the second polarizing region is substantially unchanged.

In the process of manufacturing the polarizer, in order to define the above described region to be treated of the polarizer, a mask plate for example is used, which is attached to the polarizer or the polarizing layer 1. The mask plate is made of, for example, metal, ceramic, plastic, etc. According to the inventors' further discovery, the mask plate is made of metal, and it has good heat conduction and heat dissipation; under the high-temperature and high-humidity environment, in the region of the polarizer shielded by the attached mask plate, the heat dissipation is faster and the mask plate blocks water vapor from entering the polarizing layer, and therefore, the polarization performance of the polarizing layer fails slowly or is completely maintained in the region shielded by the attached mask plate; on the contrary, in the region of the polarizer corresponding to the opening of the mask plate, that is, in the region of the polarizer that is not shielded by the attached mask plate, the heat is concentrated because the heat dissipates slowly or the heat cannot dissipate, and the water vapor enters through the opening, so that the polarization performance of this region, corresponding to the opening of the mask plate, of the polarizer is more likely to fail.

In addition, the inventors further found that Mo (molybdenum) mask plate is preferable in the process of manufacturing the polarizer; however, it should be noted that the mask plate made of other metal materials may also be used. Hereinafter, the manufacturing method of the polarizer of the embodiments of the present disclosure will be described by taking the Mo mask plate as an example.

Next, the manufacturing method of the polarizer of the embodiments of the present disclosure will be described by performing the secondary process on the polarizer as a whole.

Figure 3:
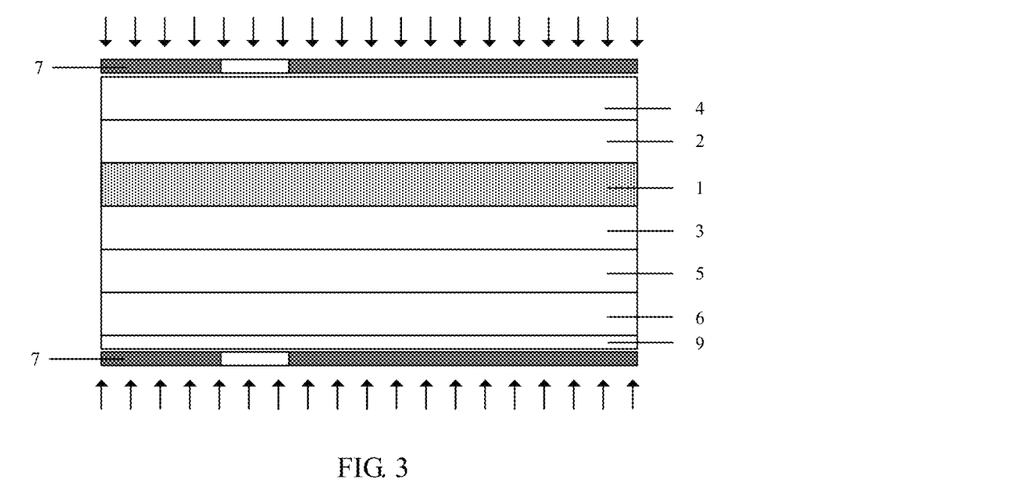
FIG. 3 is a schematic view of a manufacturing method of the polarizer in which the polarizer is treated by using high-temperature according to at least one embodiment of the present disclosure.

FIG. 3 is a schematic view of the manufacturing method of the polarizer in which the polarizer is treated by using high-temperature according to at least one embodiment of the present disclosure. For example, at first, the polarizing layer 1 to be treated is provided, and the polarizing layer 1 to be treated has the same (for example, substantially the same) light transmittance. For example, the polarizing layer 1 to be treated is treated in a state where the polarizing layer 1 is individually provided (i.e. the polarizing layer 1 is not stacked with any other layers), or in a state where an additional layer (for example, the protective layer, etc., resulting in that an entirety of the polarizer is treated) is provided on at least one surface.

As an example, the polarizer to be treated adopts the structure similar to that as shown in FIG. 2C, and has the first protective layer 2 and the second protective layer 3 respectively arranged on opposite sides of the polarizing layer 1. The polarizer to be treated for example further includes the first functional layer 4, the second functional layer 5, the adhesive layer 6, and the release layer 9, and the structure of the polarizer is shown in FIG. 2C, which is not repeated here.

The mask plate 7 has the opening corresponding to the first polarizing region (not shown in the figure) to be formed of the polarizing layer 1 to be treated. The mask plate 7 is aligned with the polarizer and arranged on at least one side of the polarizer to be treated, for example, the mask plate 7 is aligned with the polarizer and attached on at least one side of the polarizing layer 1 to be treated, or the mask plate 7 is aligned with the polarizer and attached on the additional layer provided on at least one side of the polarizing layer 1 to be treated (i.e., the mask plate 7 is attached on at least one side of the polarizer to be treated). For example, as shown in FIG. 3, the mask plate 7 is respectively arranged on both sides of the polarizer to be treated, that is, the mask plate 7 is respectively attached on the outer surface of the first functional layer 4 and the outer surface of the release layer 9 in FIG. 3, and the opening of the mask plate 7 corresponds to the first polarizing region to be formed. Here, "attach" should be understood as being "close to" and with or without a certain gap, and the width of the gap for example is greater than 0 and less than or equal to 1 mm.

Then, a treatment condition of high temperature and high humidity is applied, and the combination of the mask plate 7 and the polarizer is treated for a certain time under such treatment condition. Here, "high temperature and high humidity" means that the ambient temperature is about 85° C.~150° C., and the ambient humidity is greater than or equal to 70%. The treatment time needs to be determined according to the combination of temperature and humidity, for example, not less than 0.5 hours. In an example, the treatment condition adopted includes the ambient temperature of 125° C., the ambient humidity of 85%, and the treatment time of 2 hours.

After the above treatment, the light transmittance of the first polarizing region of the polarizing layer 1 corresponding to the opening of the mask plate 7 is increased to be greater than the light transmittance of the second polarizing region. For example, the first polarizing region with the light transmittance of more than 70% while still having a polarizing performance is obtained, and the second polarizing region with a normal light transmittance (for example, 45%) is obtained. Furthermore, by controlling the treatment condition, the ratio of the light transmittance of the first polarizing region to the light transmittance of the second polarizing region is ranged from 1.1:1 to 2.6:1. Therefore, the polarizer is secondarily treated to obtain the polarizer having a local region with a higher light transmittance and a certain polarization performance (such as the polarizer shown in FIG. 2B and FIG. 2C).

For example, the size and shape of the opening of the mask plate 7 are set according to the actual requirements. For example, for the circular first polarizing region shown in FIG. 2A, the opening of the mask plate 7 is also circular.

It should be noted that, in some examples, high temperature and high humidity is adopted at the same time; and in some examples, one of high temperature and high humidity is adopted, such as only high temperature or high humidity is adopted; and the treatment time is adaptively adjusted according to the temperature and humidity, as long as the technical effect of increasing the light transmittance of the first polarizing region is realized.

Figure 4:
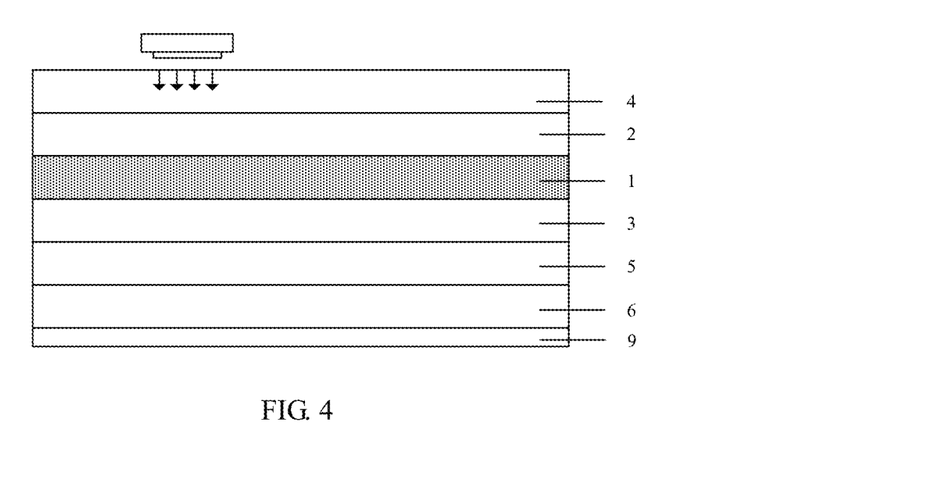
FIG. 4 is a schematic view of the manufacturing method of the polarizer in which the polarizer is treated by using light according to at least one embodiment of the present disclosure.

FIG. 4 is a schematic view of the manufacturing method of the polarizer in which the polarizer is treated by using light according to at least one embodiment of the present disclosure.

For example, the polarizer to be treated similar to FIG. 3 is provided. Light irradiation is applied to the first polarizing region to be formed of the polarizer, so that the light transmittance of the first polarizing region is increased to be greater than the light transmittance of the second polarizing region.

For example, blue light, ultraviolet light and the like is used for light irradiation treatment, and the size, power and treatment time of the light spot is adjusted according to actual requirements and the thickness of the polarizer. The adopted light source for example includes fluorescent lamp, laser, etc.

For example, in one example, the circular first polarizing region with a diameter of 10 mm is expect to be obtained, and in this case, the light spot size is adjusted as 8 mm and the treatment time is 0.5-2.5 hours. Thus, the polarizer as shown in FIG. 2B or FIG. 2C is obtained.

For example, in another example, the mask plate is used to define the region to be treated of the polarizer, and the mask plate is attached to the polarizer to be treated. The mask plate for example is made of metal, ceramic, etc.

For example, in the case where the light spot of the light source itself is small, the first polarizing region is obtained by scanning the light spot. The local region of the polarizer is scanned with the light spot, so as to obtain the first polarizing region larger than the light spot.

Embodiments of the present disclosure are not limited to the above descriptions, and the light used for example is x-ray, and the treatment condition may be adjusted accordingly according to the x-ray.

The following will describe the manufacturing method of the polarizer according to the embodiments of the present disclosure by individually treating the polarizing layer with high temperature, photocatalysis, or a reagent in the process of manufacturing the polarizer.

Figure 5:
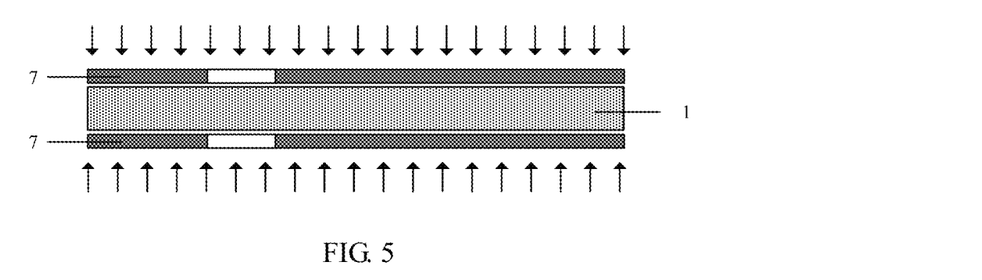
FIG. 5 is a schematic view of the manufacturing method of the polarizer in which the polarizing layer is treated by using high-temperature according to at least one embodiment of the present disclosure.
Figure 6:
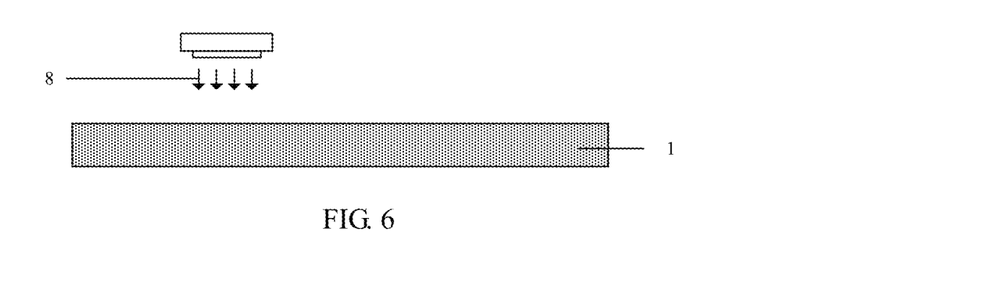
FIG. 6 is a schematic view of the manufacturing method of the polarizer in which the polarizing layer is treated by using light according to at least one embodiment of the present disclosure.

In order to obtain the polarizer which comprises the polarizing layer with local increased transmittance, high temperature and/or high humidity treatment or light treatment with the mask plate as shown in FIG. 3 and FIG. 4 can be adopted to treat the polarizing layer to form the first polarizing region with increased light transmittance, and the corresponding schematic views of these examples are shown in FIG. 5 and FIG. 6 respectively.

At first, the polarizing layer 1 to be treated with polarization performance is provided, for example, the polarizing layer is the PVA layer soaked in potassium iodide solution and then uniaxially stretched. Under this case, various additional layers or functional layers have not been attached to the polarizing layer 1, and the polarizing layer is subjected to the subsequent treatment in this state.

Figure 8:
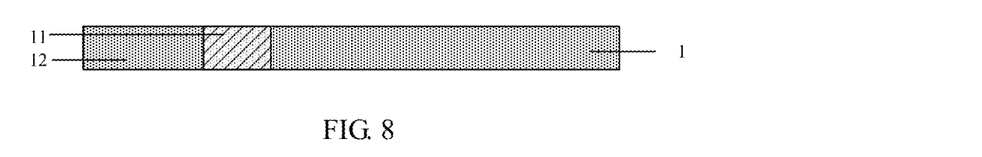
FIG. 8 illustrates a schematic view of the polarizing layer obtained by the manufacturing methods as shown in FIG. 5 to FIG. 7.

FIG. 5 corresponds to FIG. 3, and the polarizing layer 1 is treated by using high-temperature with the mask plate; FIG. 6 corresponds to FIG. 4, the polarizing layer 1 is treated by using light, and the mask plate for example is used to define the region to be treated during the light treatment process in FIG. 6. For example, the mask plate 7 is directly attached to both sides of the polarizing layer 1. Technical details and parameters may refer to previous descriptions, and will not be described in detail here. After the treatment of the polarizing layer 1, the polarizing layer 1 as shown in FIG. 8 is obtained, which includes the first polarizing region 11 and the second polarizing region 12, and the light transmittance of the first polarizing region 11 is greater than the light transmittance of the second polarizing region 12.

After manufacturing the polarizing layer 1, the additional layer is provided on at least one side of the polarizing layer according to actual requirements. For example, various additional layers, such as the first protective layer 2, the second protective layer 3, the first functional layer 4, the second functional layer 5, the adhesive layer 6, or the release layer 9, etc., are sequentially stacked on both sides of the polarizing layer.

In addition, for example, the above-mentioned high temperature and/or high humidity treatment and light treatment is performed in the state of FIG. 1A; that is, the first protective layer 2, the polarizing layer 1, the second protective layer 3 are sequentially stacked, and the polarizing layer 1 is treated to include the first polarizing region 11 and the second polarizing region 12, and the light transmittance of the first polarizing region 11 is greater than the light transmittance of the second polarizing region 12. Then, more additional layers, such as the first functional layer 4, the second functional layer 5, the adhesive layer 6, or the release layer 9 as described above are attached on the first protective layer 2 and the second protective layer 3, and will not be described in detail here.

Figure 7:
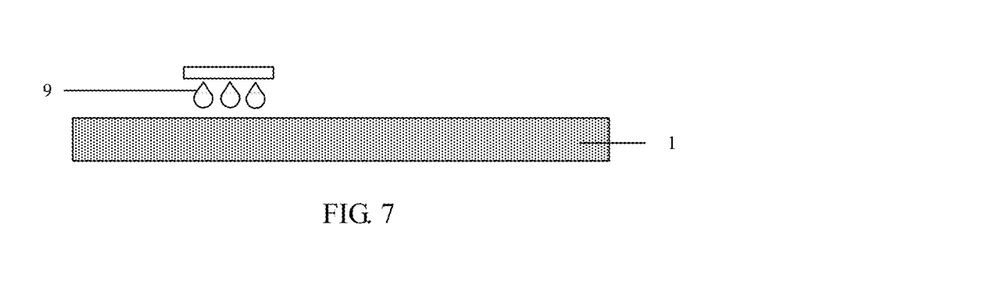
FIG. 7 is a schematic view of the manufacturing method of the polarizer in which the polarizing layer is treated by using a reagent according to at least one embodiment of the present disclosure.

In addition, FIG. 7 is a schematic view of the manufacturing method of the polarizer in which the polarizing layer is treated by using a reagent according to at least one embodiment of the present disclosure, and the mask plate for example is used to define the region to be treated. For example, the reagent is applied to the region to be treated of the polarizing layer 1 for a certain time. For example, the time is greater than or equal to 1 hour, so that the light transmittance of the treated region is increased, and the first polarizing region is obtained. For example, in the process of treating the polarizing layer 1, the ambient humidity is controlled to be greater than or equal to 70%. In an example, the reagent is distilled water to treat the polarizing layer 1 for 1-4 hours under the treatment condition of normal temperature and ambient humidity of 95%, so as to obtain the polarizing layer as shown in FIG. 8. The polarizing layer 1 includes the first polarizing region 11 and the second polarizing region 12, and the light transmittance of the first polarizing region 11 is greater than the light transmittance of the second polarizing region 12.

The reagent in the embodiments of the disclosure is not limited to distilled water, and other aqueous liquids, such as deionized water or other aqueous solutions, may be used as long as it can partially disable the polarizing performance of the polarizing layer and increase the light transmittance.

Figure 9:
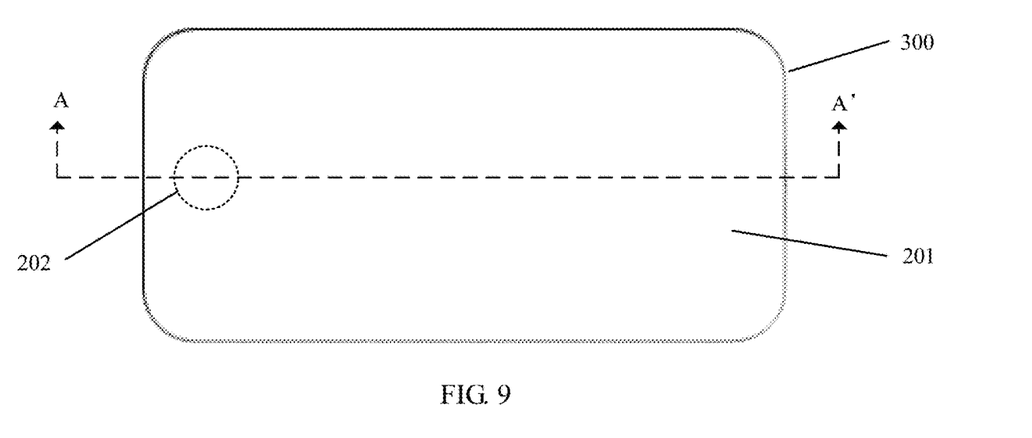
FIG. 9 is a schematic structural view of a display panel according to at least one embodiment of the present disclosure.
Figure 10:
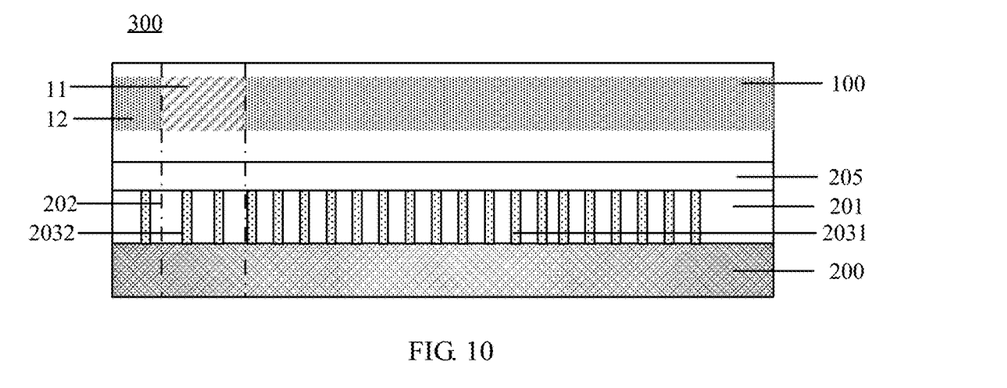
FIG. 10 illustrates a schematic cross-sectional view of the display panel according to at least one embodiment of the present disclosure taken along the line A-A'.

At least one embodiment of the present disclosure further provides a display panel 300. FIG. 9 is a schematic plan view of a display panel 300; FIG. 10 is a schematic sectional view along the section line A-A' of FIG. 9. Referring to FIG. 9 and FIG. 10, the display panel 300 is, for example, an OLED panel, which includes the polarizer 100 according to at least one embodiment of the present disclosure, and further includes a base substrate 200, a display functional layer, an encapsulation layer 205, and the like.

The encapsulation layer 205 covers the display functional layer to isolate the display functional layer from the external environment and prevent external water vapor from entering the display functional layer to degrade the performance of the display functional layer. The polarizer 100 is attached to the encapsulation layer 205 through the adhesive layer (not shown).

The display function layer is configured to realize the display function, and includes a first display region 201 and a second display region 202, for example, the second display region 202 is adjacent to the first display region. The first display region 201 includes a pixel array 2031, and the second display region 202 includes a pixel array 2032. The pixel array 2031 and the pixel array 2032 each include a plurality of pixel units arranged in an array. For example, each pixel unit includes a pixel circuit and a light-emitting element (i.e., OLED). For example, the pixel circuit adopts a 2T1C type pixel circuit (i.e., including two thin film transistors and a storage capacitor), or the pixel circuit is provided with compensation function the basis of the 2T1C type pixel circuit. The pixel circuit with compensation function is, for example, 4T1C or 4T2C, which will not be described in detail here.

Figure 11:
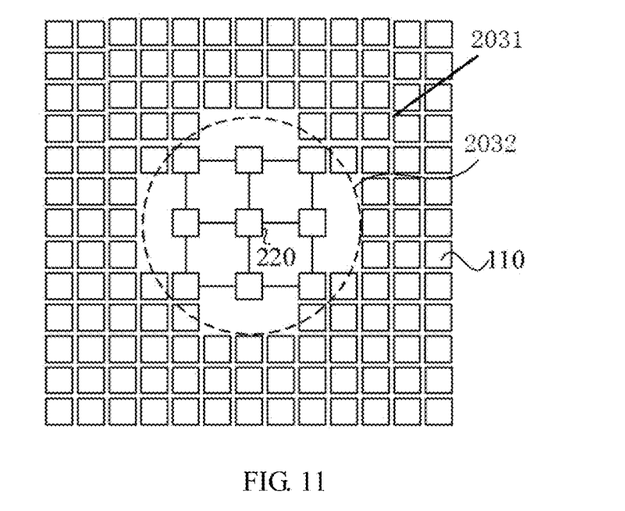
FIG. 11 is a schematic view of a pixel array of the display panel according to at least one embodiment of the present disclosure.

FIG. 11 is a schematic view of the pixel array of the display panel according to at least one embodiment of the present disclosure. The pixel array 2031 of the first display region 201 includes a plurality of first pixel units 110 arranged in an array, and the pixel array 2032 of the second display region 202 includes a plurality of second pixel units 220 arranged in an array. As shown in the figure, a density of the plurality of first pixel units 110 of the pixel array 2031 of the first display region is greater than a density of the plurality of second pixel units 220 of the pixel array 2032 of the second display region 202. Because of such arrangement, the density of the pixel units of the pixel array 2032 in the second display region 202 is low, a density of the metal electrodes in the OLED display functional layer in the second display region 202 is also low, so that the reflected light by the metal electrodes in the second display region 202 is weak, and the light transmittance of the second display region 202 is increased. In another example, the density of the plurality of first pixel units 110 of the pixel array 2031 of the first display region is equal to the density of the plurality of second pixel units 220 of the pixel array 2032 of the second display region 202.

The polarizer 100 is arranged at the light emission side of the first display region 201 and the second display region 202. An orthographic projection of the pixel array 2032 of the second display region 202 on the base substrate 200 overlaps an orthographic projection of the first polarizing region 11 of the polarizer 100 on the base substrate 200, as shown by the dashed-dotted line region in FIG. 10.

Figure 12:
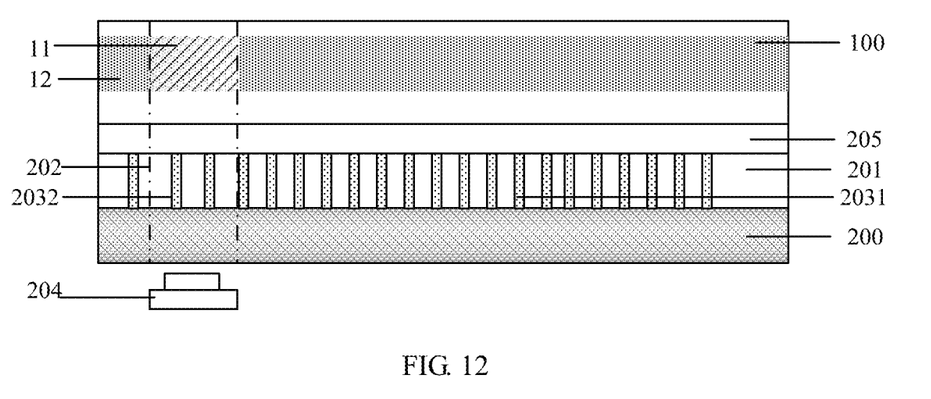
FIG. 12 illustrates a schematic view of a display device according to at least one embodiment of the present disclosure.

At least one embodiment of the present disclosure provides a display device, and FIG. 12 is a schematic view of the display device according to at least one embodiment of the present disclosure.

The display device includes the display panel 300 of the above embodiments and an image sensor 204. The image sensor 204 is arranged in the second display region 202 of the display panel 300, and the image sensor 204 is located at the side of the base substrate 200 facing away from the pixel array 203. The photosensitive surface of the image sensor 204 faces the display panel 300. For example, an orthographic projection of the image sensor 204 on the base substrate 200 at least partially overlaps the orthographic projection of the pixel array 2032 of the second display region 202 on the base substrate 200, for example, within the orthographic projection of the second display region 202 on the base substrate 200, as shown by the dashed-dotted line region in FIG. 12.

FIG. 9 exemplarily illustrates that the second display region 202 is a circular region. Referring to FIG. 10, the pixel array 2032 of the second display region 202 is configured to realize the display of the second display region 202. The light transmittance of the first polarizing region 11 of the polarizer 100 is greater than the light transmittance of the second polarizing region 12 of the polarizer 100, so that the first polarizing region 11 is configured to transmit more external light to increase the intensity of light entering the image sensor 204 and thus improve the imaging quality of the image sensor 204. Therefore, the display panel 300 according to at least one embodiment of the disclosure adopts the polarizer with the region having a higher light transmittance and a certain degree of polarization performance, and combines with the under-screen camera, which can realize the compatibility between the full screen and the under-screen camera, and improve the imaging quality of the under-screen camera.

The image sensor 204 for example adopts a structure commonly used in the art, for example, the image sensor 204 includes a CMOS image sensor array or a CCD image sensor array, and the sensor array is electrically connected with an image processor (not shown). In addition to the image sensor 204, in order to achieve a better imaging effect, the display device further includes, for example, a lens assembly, and the lens assembly and the sensor array are sequentially arranged along the optical axis of the lens assembly in the direction perpendicular to the base substrate 200.

The display panel in the embodiments of the present disclosure may be used for any products or components with display functions such as liquid crystal panels, liquid crystal televisions, displays, OLED panels, OLED televisions, electronic paper, mobile phones, tablet computers, notebook computers, digital photo frames, navigators, and the like.

Specifically, the display panel in the embodiments of the disclosure may be used in the display device with the under-screen image sensor, and the display device may further include other conventional components such as a display panel, which is not limited by the embodiments of the present disclosure.

The above are merely exemplary implementations of the present disclosure without limiting the protection scope of the present disclosure. The protection scope of the present disclosure should be based on the protection scope of the claims.

What is claimed is:

1. A polarizer, comprising: a polarizing layer, wherein
   the polarizing layer comprises a first polarizing region and a second polarizing region; and
   a light transmittance of the first polarizing region is greater than a light transmittance of the second polarizing region, and a ratio of the light transmittance of the first polarizing region to the light transmittance of the second polarizing region is 1.1:1 to 2.6:1;
   the first polarizing region has been treated to have a light transmittance of the first polarizing region by arranging a metal mask with an opening corresponding to the first polarizing region on a surface of at least one side of the polarizing layer to be treated, and placing the polarizing layer to be treated at a processing temperature for another processing time;
   a portion of the metal mask other than the opening is configured to block water vapor from entering the polarizing layer, and the opening of the metal mask serves as an unobstructed region to allow water vapor to enter the polarizing layer through the opening; and at the same time of treating the polarizing layer to be treated under the treatment temperature, the polarizing layer to be treated is under a treatment humidity.

2. The polarizer according to claim 1, wherein the first polarizing region and the second polarizing region are integral with each other.

3. The polarizer according to claim 1, wherein the light transmittance of the first polarizing region is 60% to 90%.

4. The polarizer according to claim 1, wherein the light transmittance of the second polarizing region is 35% to 55%.

5. The polarizer according to claim 1, comprising:
   a first protective layer, provided on one side of the polarizing layer; and
   a second protective layer, provided on other side of the polarizing layer.

6. The polarizer according to claim 5, wherein
   each of the first protective layer and the second protective layer is a cellulose triacetate layer; and
   the polarizing layer is a polyvinyl alcohol layer.

7. A display panel, comprising the polarizer according to claim 1.

8. The display panel according to claim 7, further comprising:
   a base substrate, and
   a display function layer, provided on the base substrate and comprising a first display region and a second display region, wherein
   the polarizer is provided on a light emission side of the display functional layer, and an orthographic projection of the second display region on the base substrate overlaps an orthographic projection of the first polarizing region on the base substrate.

9. The display panel according to claim 8, wherein
   the first display region comprises a first pixel array, the second display region comprises a second pixel array, and a density of pixel units of the first pixel array is greater than a density of pixel units of the second pixel array.

10. A display device, comprising:
the display panel according to claim 7, and
an image sensor, wherein a photosensitive surface of the image sensor faces the display panel, and an orthographic projection of the image sensor on the base substrate at least partially overlaps an orthographic projection of the second display region on the base substrate.

11. A manufacturing method of a polarizer, comprising:
providing a polarizing layer to be treated;
treating the polarizing layer to be treated to obtain a treated polarizing layer, wherein the treated polarizing layer comprises a first polarizing region and a second polarizing region, a light transmittance of the first polarizing region is greater than a light transmittance of the second polarizing region, and a ratio of the light transmittance of the first polarizing region to the light transmittance of the second polarizing region is 1.1:1 to 2.6:1; and
forming the polarizer by using the treated polarizing layer;
wherein treating the polarizing layer to be treated further comprises: providing a metal mask with an opening corresponding to the first polarizing region, arranging the metal mask on a surface of at least one side of the polarizing layer to be treated, wherein a portion of the metal mask other than the opening is configured to block water vapor from entering the polarizing layer, and the opening of the metal mask serves as an unobstructed region to allow water vapor to enter the polarizing layer through the opening; placing the polarizing layer to be treated at a processing temperature for a processing time to increase the light transmittance of the first polarizing region to be greater than that of the second polarizing region; and at the same time of treating the polarizing layer to be treated under the treatment temperature, the polarizing layer to be treated is under a treatment humidity.

12. The manufacturing method according to claim 11, wherein the treating the polarizing layer to be treated comprises:
treating the first polarizing region, so that the light transmittance of the first polarizing region is increased to be greater than the light transmittance of the second polarizing region.

13. The manufacturing method according to claim 11, wherein before the treating the polarizing layer to be treated, the method further comprises:
forming an additional layer on at least one side of the polarizing layer to be treated, thereby the polarizing layer to be treated is treated in a state where the additional layer is formed.

14. The manufacturing method according to claim 11, wherein the treating the polarizing layer to be treated further comprises:
providing a mask plate with an opening corresponding to the first polarizing region,
attaching the mask plate on at least one side of the polarizing layer to be treated,
treating the polarizing layer to be treated under a treatment temperature for a treatment time, so that the light transmittance of the first polarizing region is increased to be greater than the light transmittance of the second polarizing region.

15. The manufacturing method according to claim 14, wherein
the treatment temperature is 85° C. to 150° C., the treatment humidity is greater than or equal to 70%, and the treatment time is greater than or equal to 0.5 hours.

16. The manufacturing method according to claim 11, wherein the treating the polarizing layer to be treated further comprises:
irradiating light to the first polarizing region of the polarizing layer to be treated so as to increase the light transmittance of the first polarizing region to be greater than the light transmittance of the second polarizing region.

17. The manufacturing method according to claim 16, wherein
the light that is irradiated comprises blue light, ultraviolet light, or x-ray.

18. The manufacturing method according to claim 11, wherein the treating the polarizing layer to be treated further comprises:
applying a reagent to the first polarizing region of the polarizing layer to be treated under a treatment humidity for a treatment time, wherein the treatment humidity is greater than or equal to 70%, and the treatment time is greater than or equal to 0.5 hours.

* * * * *